Oct. 3, 1967 L. C. ROGERS 3,345,216

METHOD OF CONTROLLING CHANNEL FORMATION

Filed Oct. 7, 1964

INVENTOR.
Leo C. Rogers

BY Mueller & Aichele

ATT'YS.

United States Patent Office 3,345,216
Patented Oct. 3, 1967

3,345,216
METHOD OF CONTROLLING CHANNEL FORMATION

Leo C. Rogers, Phoenix, Ariz., assignor to Motorola, Inc., Chicago, Ill., a corporation of Illinois Filed Oct. 7, 1964, Ser. No. 402,182
6 Claims. (Cl. 148—1.5)

This invention relates to the semiconductor art and particularly to methods of forming and adjusting the charge concentrations beneath dielectric films covering semiconductor material.

Electrically charged regions at semiconductor surfaces have been responsible for a variety of useful as well as troublesome phenomena in the semiconductor art. When a region of semiconductor material such as silicon or germanium is electrically charged, certain characteristics of this material are altered as long as the charge remains. The most important alteration perhaps is the change in resistivity which occurs.

Resistivity changes accompanying the formation of surface charge layers have been a particularly interesting problem in those semiconductor devices where insulating oxide films are used to cover portions of the surfaces of semiconductor material. Charge layers tend to form beneath these oxides, and have a much more permanent character than similar layers formed on unpassivated semiconductor material.

Patent No. 3,226,613 issued to John C. Haenichen on Dec. 28, 1965, and assigned to the present assignee, describes the use of oxide films to deliberately form an electrically charged layer known as an induced channel in order to permit the manufacture of bipolar transistors operable at high voltages. Such channels are described in that application were induced using oxides with certain ionized or electrically active materials within and these channels were adjustable by reducing the oxide thickness.

In order to form oxides which would consistently induce the desired channel in terms of a specified sheet resistivity in the manufacture of the high voltage bipolar transistors, it was necessary to use considerable care in growing the oxide. Moreover diffusion steps have a tendency to change the character of these oxides, rendering the control of channel thickness, resistivity and conductivity type more difficult.

In the isolated gate field effect, transistor, the channel is induced in the region between the source and the drain. There are problems in the manufacture of these devices which are associated with the induced channel, and these are substantially the same as the problems encountered in the preparation of the induced channel in the manufacture of the high voltage bipolar transistor previously described.

An object of this invention is to provide a method of forming and controlling channels beneath an oxide film which is simple and relatively independent of the method of growing the oxide film and its subsequent treatment.

A feature of this invention is the treatment of oxide films with aluminum or magnesium so as to induce a substantial electron concentration in the silicon beneath the surface of the oxide while preserving the insulating properties of the oxide.

Figure 1A:
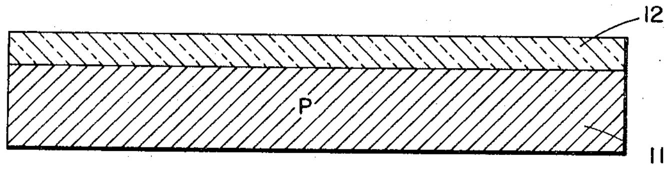
Figure 1B:
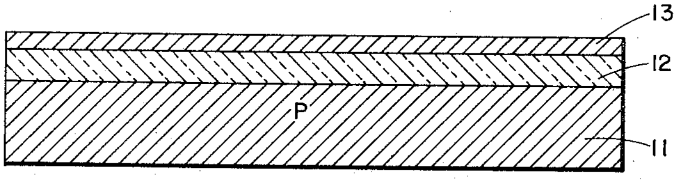
Figure 1C:
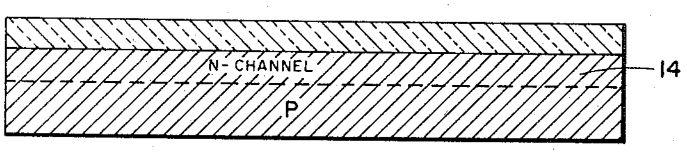
Figure 1D:
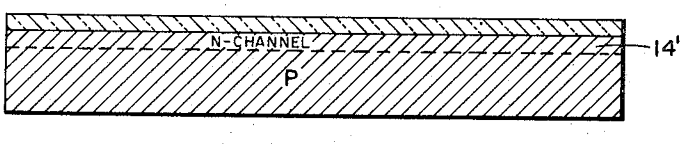
Figure 2:
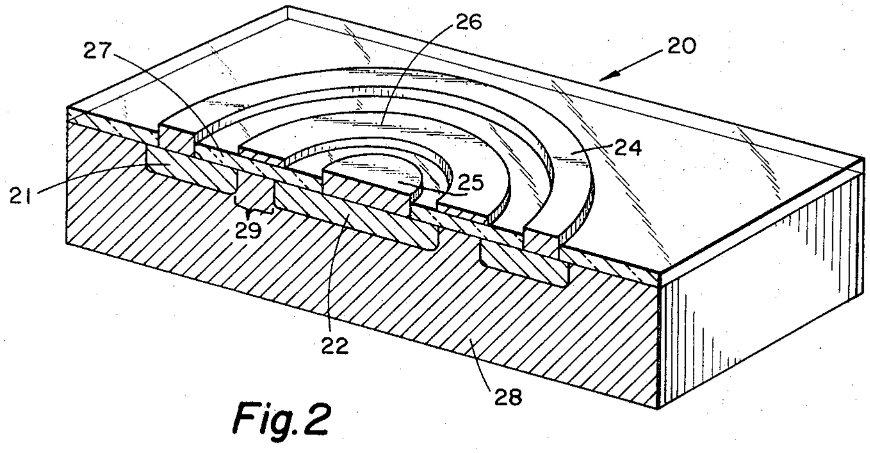

In the accompanying drawings:

FIG. 1 shows the steps of treating a film of oxide on a semiconductor surface so as to induce a substantial electron concentration beneath the oxide; and FIG. 2 shows structures used in the measurement of the effect of forming channels in accordance with this invention.

In the method of this invention, substantial negative charge may be induced beneath a completed oxide film such as silicon dioxide or one of the various silicate glasses used in the manufacture and the passivation of semiconductor devices by simply evaporating and depositing a thin film of aluminum or magnesium on the surface of the oxide and then, if the deposited film is undesirable, etching it away. This method may be used to form N type channels at the surface of P type semiconductor material or simply to adjust the resistivity of either N or P type semiconductor material in thin regions beneath the oxide surface.

The method is described below with reference to FIG. 1. In this embodiment a P type silicon wafer is described, but the processing steps are identical for silicon oxide covered wafers of germanium and silicon regardless of type or resistivity.

In FIG. 1A there is shown a portion of a wafer 11 of silicon having a film 12 of silicon oxide on the surface thereof. The silicon oxide may contain phosphorus and various other materials in small quantities. An essential characteristic of the silicon oxide material is that it exhibits good dielectric properties such as found in the silicon glasses used in the passivation of transistors or other semiconductor devices.

A thin film of aluminum 13 is evaporated onto the surface of the oxide as shown in FIG. 1B. The film is deposited by ordinary vacuum evaporation techniques, usually at pressures below $10^{-5}$ millimeters of mercury and at substrate temperatures below 100° C. The substrate temperature does not appear to be critical, so for convenience the substrate is usually at room temperature (25° C.). As a result of the aluminum 13 being deposited on the silicon oxide 12, a layer 14 having a high concentration of electrons is formed beneath the oxide 12 as indicated. The layer is considered, for convenience, as having a discrete boundary which, of course, it does not have. The distribution of electrons is probably some form of exponential distribution having a large concentration at the surface with the charge density falling off exponentially with distance from the surface. The thickness of the layer will be considered the depth at which the charge concentration is equal to the uncompensated or excess donor or acceptor impurity concentration of the semiconductor material in which the layer is induced.

Subsequently, the aluminum 13 can be etched from the surface of the oxide 12 using an etch which does not attack the oxide. A suitable etch is composed of, by volume, 10% $H_2O$ and the following concentrated acids: $H_3PO_4$, 80%; $HNO_3$, 5%; $CH_3COOH$, 5%. The material is etched at 25° C. until the aluminum is no longer visible on the surface of the oxide. Surprisingly, the layer 14 remains substantially unaltered after the aluminum is etched away as shown in FIG. 1C. This layer 14 is usually referred to as a channel when it has a sufficient concentration of electrons to cause an N region on the surface of P type material as in this case. It has substantially the same characteristics as a region of true N type semiconductor material. The transition region between the induced N type region and the underlying P type region acts like a typical PN junction.

To adjust the layer to a desired thickness, the oxide 12 may be etched away. The charge concentration in the semiconductor material falls off rapidly as the oxide is reduced in thickness. The reduced amount of charge will result in a thinner channel (the layer 14') as would be expected and as indicated in FIG. 1D. The channel region 14' may be thinned as much as desired by reducing the oxide until the oxide has been reduced to a thickness at which the surface concentration of negative charges is neutralized by the P type substrate at which point the channel disappears. Above a certain thickness, the channel appears to be independent of the oxide thickness. This thickness is about 2300–3000 angstrom units for silicon dioxide on an approximately 10 ohm-centimeter P type wafer. The metal magnesium also exhibits similar negative charge inducing properties.

Why aluminum and magnesium cause a negatively charged region beneath the silicon oxide is not fully understood. A possible mechanism for its formation is that the metal combines with the oxygen in the silicon oxide to form an ion such as $SiO^{++}$, some of which in fulfilling the need for $O^{--}$ are able to take oxygen from a nearby molecule to form an ion nearer the surface of the silicon. This action continues forming a distribution of ions in the oxide until the silicon substrate is reached in which position the reaction tends to stop as there is no more silicon dioxide. The negative charges are induced by the distributed positive charges of the $SiO^{++}$ ions.

To determine the effect of aluminum films in producing channels and to study their properties, a structure equivalent to the structure 20 shown in FIG. 2 was prepared. This structure is substantially that of a silicon isolated gate field effect transistor having a first N type region forming a source 21 and a second N type region forming a drain 22, with the outer ring of aluminum being the source connection 24 and the inner circular disk of aluminum being the drain connection 25. The aluminum film 26 which is formed as an inner ring over the silicon dioxide layer 27 is equivalent to an isolated gate. Measurements of the source-to-drain current conducting ability of the structure were taken (1) before the aluminum film 26 was deposited, (2) after deposition with the aluminum film 26 as shown in FIG. 2, (3) after an etching step in which the film 26 was removed, and (4) after each of a number of etching steps in which the silicon oxide 27 was made progressively thinner. Measurements were made before depositing the aluminum using a P type die 28 of 10 ohm-centimeter silicon with a silicon dioxide film 27 5000 angstroms thick, a channel length of approximately 12.7 mils, and a source-to-drain separation of 2.5 mils. With 10 volts applied between source and drain, a source-to-drain current ($I_{SD}$) of less than 300 nanoamperes was measured. With aluminum deposited at room temperature on the portion of the silicon dioxide between the source and drain as shown in FIG. 2, 10 volts between source and drain produces a source-to-drain current of over 10 milliamperes to a maximum of about 40 milliamperes. When the aluminum film 26 is removed from the structure 20, the source-to-drain current changes only in a slight amount.

Table 1 shows the effect on $I_{SD}$ of treating the oxide with aluminum and etching away first the aluminum and then the oxide. A structure 20 was initially fabricated with 6500 angstrom units of silicon dioxide over the region between the source and the drain and values of $I_{SD}$ (at 10 volts source-to-drain voltage) for the structure with and without the aluminum film 26 and with various thicknesses of oxide are as shown in Table 1.

TABLE 1

| Oxide thickness (A.): | $I_{SD}$ (milliamperes) |
|---|---|
| 6500 (with aluminum) | 23.6 |
| 6500 (aluminum removed) | 22.4 |
| 5500 | 22.0 |
| 4500 | 22.0 |
| 4000 | 21.9 |
| 3000 | 22.3 |
| 2500 | 23.6 |
| 2000 | 15.0 |
| 1000 | 17.0 |
| 700 | 9.6 |
| 500 | 7.0 |
| 300 | 1.5 |
| 200 and less | 0.0 |

Note that the source-to-drain current, $I_{SD}$, does not vary significantly in the range 6500 A. to 3000 A. but at 2500 A. $I_{SD}$ is substantially larger than the preceding values. Another increase may be noted at 1000 A. where $I_{SD}$ is slightly larger than $I_{SD}$ for 2000 A. The reason for these increases is not known.

Certain silicon oxides are much less sensitive to the effects of aluminum films than others. Those mixed oxides containing, in addition to silicon, substantial amounts of boron and aluminum are only slightly affected. On P type silicon, when these oxides rather than silicon dioxide, for example, are metallized with an aluminum film, channels of lesser degree are produced.

Since aluminum films are frequently used on silicon oxide covered integrated circuits to interconnect the various components and across the oxide coated surfaces of various types of transistors and diodes, the substitution of a mixed oxide of boron, aluminum and silicon for those presently in use in many cases would result in the elimination or reductions of undesirable effects due to channels such as current leakage beneath the oxide or to minimize resistivity changes in the semiconductor material beneath the aluminum.

A mixed oxide which is very insensitive to the effects of aluminum and magnesium films contains approximately 10% boron oxide, 60% aluminum oxide and 30% silicon dioxide. Typically, current flow through an aluminum-induced channel beneath this oxide is two or more orders of magnitude less than in a channel of silicon dioxide as measured using the experimental device previously described and shown (FIG. 2). Oxides having the following composition range are most useful in reducing the effect of the aluminum thin film: boron oxide 0 to 25%, aluminum oxide 25 to 75%, and silicon dioxide 0 to 75%.

It is apparent that the method of treating certain silicon oxide films on semiconductor material in accordance with this invention permits the induction, adjustment and control of negative charge layers in the semiconductor material immediately beneath the surface of the silicon oxides. These methods may be utilized wherever desirable to treat the semiconductor materials so as to render the surface portion more N type. Possible applications would include forming N type channels on P conductivity semiconductor material, forming $N^+$ regions on N type semiconductor material and compensating P type material so as to create a high resistivity P type layer near the surface of the semiconductor material.

What is claimed is:

1. A method of forming N type channels at surfaces of P type semiconductor material comprising (a) forming a layer of silicon oxide over said surfaces, (b) depositing on said silicon oxide a film of a metal from the group consisting of aluminum and magnesium, (c) removing said film of metal from said metallic oxide, (d) and etching said oxide to a reduced thickness not less than approximately 200 angstroms to thereby form a channel having desired characteristics.

2. A method of controlling induced channels of N type conductivity when utilizing films of a metal selected from the group consisting of aluminum and magnesium on a semiconductor surface comprising (a) depositing a film of mixed oxide on said semiconductor surface, said mixed oxide having a composition range of 0% to 25% boron oxide, 25% to 75% aluminum oxide, and 0% to 25% silicon oxide, (b) and depositing said thin film of said selected metal on the surface of said mixed oxide.

3. A method of forming N type channels at surfaces of P type semiconductor material comprising (a) forming a layer of silicon oxide over said surfaces, (b) depositing on said silicon oxide a film of magnesium, (c) removing said film of magnesium from said silicon oxide, (d) and etching said oxide to a reduced thickness not less than approximately 200 angstroms to thereby form a channel having desired resistivity characteristics.

4. A method of forming N type channels at surfaces of P type semiconductor material, said P type semiconductor material having first and second N type regions therein which may be used as source and drain regions of a field effect transistor, said method comprising (a) forming a layer of silicon oxide over said surfaces,
(b) removing a portion of said oxide over said first region,
(c) depositing an outer metal ring in electrical contact with said first N type region where the oxide portion is removed, and
(d) depositing an inner metal ring on the surface of said silicon oxide and above a P type region which extends between said first and second N type regions, said inner metal ring selected from the group consisting of aluminum and magnesium to induce an N type channel in said P type region which extends between said first and second N type regions.

5. A method of forming N type channels at surfaces of P type semiconductor material, said P type semiconductor material having first and second N type regions therein which may be used as source and drain regions of a field effect transistor, said method comprising (a) forming a layer of silicon oxide over said surfaces,
(b) removing a portion of said oxide over said first region,
(c) depositing an outer metal ring in electrical contact with said first N type region where the oxide portion is removed,
(d) depositing an inner metal ring on the surface of said silicon oxide and above a P type region which extends between said first and second N type regions, said inner metal ring selected from the group consisting of aluminum and magnesium to induce an N type channel in said P type region which extends between said first and second N type regions, and
(e) removing said inner metal ring from the surface of said silicon oxide.

6. A method of forming an N type channel at the surface of a P type semiconductor body, which body contains at least two separate N type regions therein operative as source and drain regions of a field effect transistor, said method comprising (a) forming a layer of silicon oxide over one surface of said body,
(b) removing portions of said oxide coating which overlie said two N type regions,
(c) depositing an outer metal ring and an inner metal contact where portions of said silicon oxide are removed to thereby make electrical contact with said two N type regions, and
(d) depositing an inner metal ring on said silicon oxide coating above a P type region which extends between said two N type regions, said inner metal ring positioned between said outer metal ring and said metal contact to induce an N type channel between said two N type regions, said inner metal ring selected from the group consisting of aluminum and magnesium.

References Cited

UNITED STATES PATENTS

| | | | |
|---|---|---|---|
| 3,104,991 | 9/1963 | MacDonald | 148—1.5 |
| 3,154,439 | 10/1964 | Robinson | 148—1.5 |
| 3,158,788 | 11/1964 | Last. | |
| 3,165,430 | 1/1965 | Hugle | 148—1.5 |
| 3,183,128 | 5/1965 | Leistiko et al. | 148—33.4X |
| 3,203,840 | 8/1965 | Harris | 148—187 |
| 3,210,225 | 10/1965 | Brixey | 148—187 |
| 3,226,613 | 12/1965 | Haenichen | 148—33 |

HYLAND BIZOT, *Primary Examiner.*